United States Patent
Pan et al.

(10) Patent No.: US 10,365,743 B2
(45) Date of Patent: Jul. 30, 2019

(54) ARRAY SUBSTRATE, DISPLAY PANEL AND DISPLAY DEVICE

(71) Applicant: XIAMEN TIANMA MICRO-ELECTRONICS CO., LTD., Shanghai (CN)

(72) Inventors: Chaohuang Pan, Xiamen (CN); Zhaokeng Cao, Shanghai (CN); Zhiwei Zhou, Shanghai (CN)

(73) Assignee: XIAMEN TIANMA MICRO-ELECTRONICS CO., LTD., Xiamen (CN)

(*) Notice: Subject to any disclaimer, the term of this patent is extended or adjusted under 35 U.S.C. 154(b) by 0 days.

(21) Appl. No.: 15/787,970

(22) Filed: Oct. 19, 2017

(65) Prior Publication Data

US 2018/0039364 A1 Feb. 8, 2018

(30) Foreign Application Priority Data

Jun. 29, 2017 (CN) .............................. 201710513473

(51) Int. Cl.
*G06F 3/041* (2006.01)
*H01L 27/12* (2006.01)
(Continued)

(52) U.S. Cl.
CPC ........ *G06F 3/0412* (2013.01); *G02F 1/13454* (2013.01); *G02F 1/13458* (2013.01);
(Continued)

(58) Field of Classification Search
CPC ...... G02F 1/1345–13458; G02F 2001/133388; G02F 1/133514; G02F 1/13454;
(Continued)

(56) References Cited

U.S. PATENT DOCUMENTS 9,817,512 B1* 11/2017 Kim .................... G06F 3/0418
2006/0176266 A1* 8/2006 Pak ..................... G02F 1/13338
345/104
(Continued)

FOREIGN PATENT DOCUMENTS

CN 105572936 A 5/2016
CN 105609037 A 5/2016
(Continued)

*Primary Examiner* — Sanjiv D. Patel
(74) *Attorney, Agent, or Firm* — Alston & Bird LLP (57) ABSTRACT

An array substrate, a display panel and a display device are provided. The array substrate includes a display area and a non-display area surrounding the display area. The display area includes a plurality of data lines and a plurality of first touch electrodes. A plurality of data signal lines and a plurality of discrete pads are provided in a first non-display area at a side of the display area. Each data signal line is connected to at least one data line, each pad is electrically connected to a respective data signal line, and at least one pad is electrically connected to a respective first touch electrode. The pads are configured to supply a data signal to the data lines in a display phase and to supply a touch signal to the first touch electrodes in a touch phase.

18 Claims, 7 Drawing Sheets

(51) Int. Cl.
*H01L 23/00* (2006.01)
*G06F 3/044* (2006.01)
*G02F 1/1345* (2006.01)
*G02F 1/1333* (2006.01)

(52) U.S. Cl.
CPC ............ *G06F 3/044* (2013.01); *G06F 3/0416* (2013.01); *H01L 24/06* (2013.01); *H01L 24/16* (2013.01); *H01L 27/124* (2013.01); *G02F 2001/13456* (2013.01); *G02F 2001/133388* (2013.01); *G09G 2300/0408* (2013.01); *H01L 2224/06155* (2013.01); *H01L 2224/16145* (2013.01)

(58) Field of Classification Search
CPC ......... G09G 2300/0426; G09G 3/3648; G09G 2300/0408; G06F 3/0412; G06F 3/044; G06F 3/0416; G06F 3/041; H01L 27/1214
See application file for complete search history.

(56) References Cited

U.S. PATENT DOCUMENTS

| | | | |
|---|---|---|---|
| 2013/0307817 A1* | 11/2013 | Kim | G06F 3/0412 345/174 |
| 2015/0177859 A1* | 6/2015 | Zhou | G06F 3/041 349/12 |
| 2016/0328072 A1* | 11/2016 | Yang | G06F 3/0416 |
| 2017/0017325 A1* | 1/2017 | Tsai | G06F 3/0412 |
| 2017/0031520 A1* | 2/2017 | Kang | G06F 3/0418 |
| 2018/0059832 A1* | 3/2018 | Cho | G09G 3/3648 |
| 2018/0059855 A1* | 3/2018 | Gwon | G06F 3/0412 |
| 2018/0239476 A1* | 8/2018 | Yoshida | G02F 1/1345 |

FOREIGN PATENT DOCUMENTS

| | | |
|---|---|---|
| CN | 106020556 A | 10/2016 |
| CN | 106445251 A | 2/2017 |
| CN | 107797687 A | 3/2018 |
| CN | 106707575 A | 5/2018 |
| KR | 20160150486 A | 12/2016 |

\* cited by examiner

ARRAY SUBSTRATE, DISPLAY PANEL AND DISPLAY DEVICE

CROSS-REFERENCES TO RELATED APPLICATIONS

This application claims priority to Chinese patent application No. CN201710513473.5, filed on Jun. 29, 2017, the disclosure of which is incorporated herein by reference in its entirety.

TECHNICAL FIELD

Embodiments of the present disclosure relate to display technologies, and in particular, to an array substrate, a display panel and a display device.

BACKGROUND

The addition of touch functions to a display screen enriches the interactive mode between a user and an electronic device. Touch display screens are popular with users and are widely used in various electronic devices.

A touch display screen in the related art includes a display area and a non-display area surrounding the display area. A plurality of touch electrodes and a plurality of data lines are provided in the display area. The non-display area is provided with a control chip, a touch electrode driving circuit, a touch electrode signal selection circuit, and a demultiplexer. In a display phase, the control chip transmits a data driving signal to the demultiplexer via a data pin, the demultiplexer processes the data driving signal and then sends the data driving signal to a corresponding data line. In a touch phase, a touch signal control pin of the control chip outputs a touch control signal to the touch electrode driving circuit, the touch driving circuit generates a touch driving signal based on the received touch control signal and transmits it to the touch electrode signal selection circuit, and then the touch electrode signal selection circuit transmits the corresponding touch driving signal to each touch electrode.

In the touch display screen of the related art, a first wire is used for electrically connecting the data pin of the control chip to the demultiplexer, and a second wire is used for electrically connecting the touch electrode driving circuit to the touch electrode signal selection circuit. The control chip, the touch electrode driving circuit, the touch electrode signal selection circuit and the demultiplexer are sequentially disposed in a direction from an edge of the display screen to the display area, so the first wire intersects the second wire and the first wiring and the second wiring are insulated from each other, which increases a thickness of the display screen. In addition, the control chip of the touch display screen needs to be specially provided with the touch signal control pin, and the touch electrode signal selection circuit in a large volume is disposed in a large space, resulting in a large bezel of the touch display screen.

SUMMARY

The present disclosure provides an array substrate, a display panel and a display device to reduce the number of pins in a control chip, to reduce the thickness of a touch display device and the width of a lower bezel.

In a first aspect, an embodiment of the present disclosure provides an array substrate. The array substrate includes a display area and a non-display area surrounding the display area. The display area comprises a plurality of data lines and a plurality of first touch electrodes, a plurality of data signal lines and a plurality of discrete pads are provided in a first non-display area at a side of the display area. Each of the plurality of data signal lines is connected to at least one of the plurality of data lines, each of the plurality of pads is electrically connected to a respective one of the plurality of data signal lines. At least one of the plurality of pads is electrically connected to a respective one of the plurality of first touch electrodes; and the plurality of pads are configured to supply a data signal to the plurality of data lines in a display phase and to supply a touch signal to the plurality of first touch electrodes in a touch phase.

In a second aspect, an embodiment of the present disclosure provides a display panel. The display panel includes the array substrate in the first aspect and a color filter substrate opposite to the array substrate.

In a third aspect, an embodiment of the present disclosure provides a display device. The display device includes the display panel in the second aspect.

The array substrate provided by the present embodiment includes the display area and the non-display area surrounding the display area. The display area includes the plurality of data lines and the plurality of first touch electrodes. The plurality of data signal lines and the plurality of discrete pads are provided in the first non-display area at the side of the display area. Each of the plurality of data signal lines is connected to at least one of the plurality of data lines. Each of the plurality of pads is electrically connected to a respective one of the plurality of data signal lines. At least one of the plurality of pads is electrically connected to a respective one of the plurality of first touch electrodes. The plurality of pads are configured to supply the data signal to the plurality of data lines in the display phase and configured to supply the touch signal to the plurality of first touch electrodes in the touch phase.

BRIEF DESCRIPTION OF DRAWINGS

Other features, objects and advantages of the present disclosure will become more apparent from a detailed description of non-restrictive embodiments with reference to the following accompanying drawings.

DETAILED DESCRIPTION

To further elucidate technical means and technical effects for achieving an intended purpose of the present disclosure, embodiments, structures, features and effects of a display panel and a method for manufacturing the same according to the present disclosure are described hereinafter in detail with reference to accompanying drawings and embodiments.

An embodiment of the present disclosure provides an array substrate. The array substrate includes a display area and a non-display area surrounding the display area.

The display area includes a plurality of data lines and a plurality of first touch electrodes.

A plurality of data signal lines and a plurality of discrete pads are provided in a first non-display area at a side of the display area.

Each of the plurality of data signal lines is connected to at least one of the plurality of data lines. Each of the plurality of pads is electrically connected to a respective one of the plurality of data signal lines. At least one of the plurality of pads is electrically connected to a respective one of the plurality of first touch electrodes.

The plurality of pads are configured to supply a data signal to the plurality of data lines in a display phase and configured to supply a touch signal to the plurality of first touch electrodes in a touch phase.

The array substrate provided by the present embodiment includes the display area and the non-display area surrounding the display area. The display area includes the plurality of data lines and the plurality of first touch electrodes. The plurality of data signal lines and the plurality of discrete pads are provided in the first non-display area at the side of the display area. Each of the plurality of data signal lines is connected to at least one of the plurality of data lines. Each of the plurality of pads is electrically connected to a respective one of the plurality of data signal lines. At least one of the plurality of pads is electrically connected to a respective one of the plurality of first touch electrodes. The plurality of pads are configured to supply the data signal to the plurality of data lines in the display phase and configured to supply the touch signal to the plurality of first touch electrodes in the touch phase, so that the plurality of pads can supply corresponding signals in different phases, the time division multiplexing of the pads is achieved, the quantity of the pads is reduced, and it is not necessary to arrange other functional circuits between the pads, the data lines and the touch electrodes, facilitating a narrow lower bezel of the display device.

The above is the core idea of the present disclosure. Technical solutions in embodiments of the present disclosure will be described clearly and completely in conjunction with accompanying drawings in embodiments of the present disclosure. Apparently, the described embodiments are merely part, not all, of embodiments of the present disclosure. Based on embodiments of the present disclosure, all other embodiments obtained by those skilled in the art without creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the spirit of the present disclosure. Therefore, the present disclosure is not limited to the specific embodiments disclosed below.

The present disclosure will be described in detail with reference to schematic diagrams. In detailed description of embodiments of the present disclosure, for ease of description, schematic diagrams illustrating structures of devices and components are not partially enlarged in accordance with a general proportional scale. The schematic diagrams are merely illustrative and are not intended to limit the scope of the present disclosure. In practice, manufacturing involves three-dimension spatial sizes: length, width and height.

Figure 1:
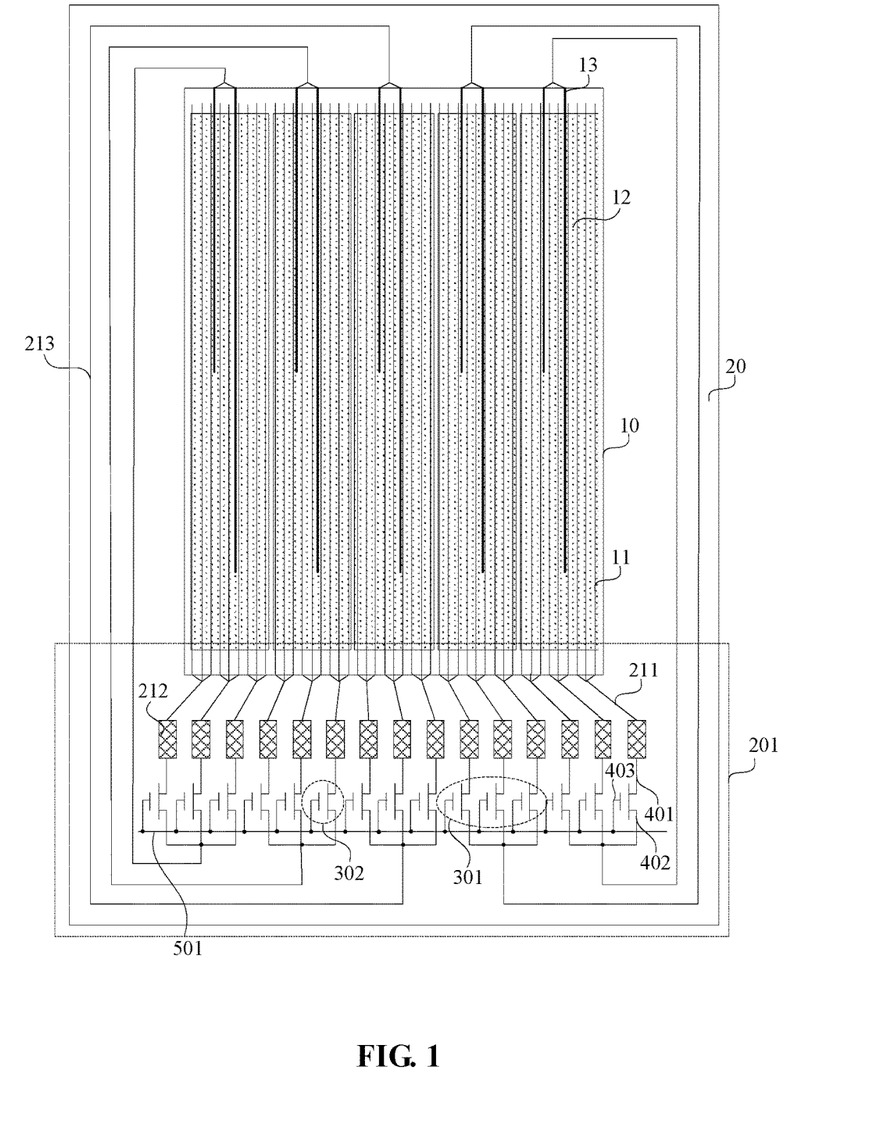
FIG. 1 is a schematic view of a structure of an array substrate according to an embodiment of the present disclosure.

FIG. 1 is a schematic view of a structure of an array substrate according to an embodiment of the present disclosure. As shown in FIG. 1, the array substrate includes a display area 10 and a non-display area 20 surrounding the display area 10. The display area 10 includes a plurality of data lines 11 and a plurality of first touch electrodes 12. A plurality of data signal lines 211 and a plurality of discrete pads 212 are provided in a first non-display area 201 at a side of the display area 10. Each data signal line 211 is connected to at least one data line 11. Each pad 212 is electrically connected to a respective data signal line 211. At least one pad 212 is electrically connected to a respective first touch electrode 12. The pads 212 are configured to supply a data signal to the data lines 11 in a display phase and configured to supply a touch signal to the first touch electrodes 12 in a touch phase.

The array substrate provided by the present embodiment includes the display area 10 and the non-display area 20 surrounding the display area 10. The display area 10 includes the plurality of data lines 11 and the plurality of first touch electrodes 12. The plurality of data signal lines 211 and the plurality of discrete pads 212 are provided in the first non-display area 201 at the side of the display area 10. Each data signal line 211 is connected to at least one of data line 11. Each pad 212 is electrically connected to a respective data signal line 211. At least one pad 212 is electrically connected to a respective first touch electrode 12. The plurality of pads 212 are configured to supply the data signal to the plurality of data lines 11 in the display phase and configured to supply the touch signal to the plurality of first touch electrodes 12 in the touch phase, so that the pads 212 can supply corresponding signals in different phases, the time division multiplexing of the pads 212 is achieved, the quantity of the pads 212 is reduced, and it is not necessary to arrange other functional circuits between the pads 212, the data lines 11 and the touch electrodes 12, facilitating a narrow lower bezel of the display device.

Exemplarily, as shown in FIG. 1, at least the first non-display area 201 may be provided with a plurality of touch signal lines 213 therein. The display area 10 includes a plurality of touch lines 13. Touch lines 13 connected to the same touch signal line 213 are connected to the same first touch electrode 12. A plurality of first thin film transistor groups 301 are provided in the first non-display area 201. Each first thin film transistor group 301 includes at least one first thin film transistor 302. A first electrode 401 of each first thin film transistor 302 in each first thin film transistor group is connected to a respective pad 212, and a second electrode 402 of each first thin film transistor 301 in each first thin film transistor group is connected to the same touch signal line 213.

It should be noted that, as shown in FIG. 1, the touch signal lines 213 may be connected to the touch lines 13 at a side of the display area away from the pads 212. Optionally, in other implementations of the present embodiment, the touch signal lines 213 may be connected to the touch lines 13 at a side of the display area next to the pads 212.

Exemplarily, the first electrode 401 of the first thin film transistor 302 may be a source electrode, and the second electrode 402 may be a drain electrode. In addition, in the present embodiment, one touch signal line 213 in the non-display area 20 is split to multiple touch lines 13, and the multiple touch lines 13 corresponding to each touch signal line 213 is connected to different positions of the same first touch electrode 12. Such configuration allows a touch driving signal to be transmitted to the first touch electrode 12 more evenly, avoiding a phenomenon that the touch driving signal becomes weaker due to signal attenuation at a position far away from the connecting point of the touch line 13 and the first touch electrode 12.

It should be further noted that, as shown in FIG. 1, when each first thin film transistor 302 is turned on, at least one pad 212 connected to the first thin film transistors 302 in the same group is electrically connected to the same touch signal line 213. Thanks to such configuration, on the one hand, when a certain pad 212 cannot supply a touch driving signal properly, the corresponding touch signal line 213 can still obtain the touch driving signal from another pad 212; on the other hand, the at least one pad 212 connected to the first thin film transistors 302 in the same group is electrically connected to each other, ensuring a better stability in the touch driving signal on the touch signal line 213 which is connected to the at least one pad 212.

Optionally, as shown in FIG. 1, the gate electrodes 403 of all the first thin film transistors 302 may be connected to a same control signal line 501. Such configuration allows all of the first thin film transistors 302 to be turned on under the control of the same control signal, simplifying the operation, and since only one touch signal line 501 is required, the first non-display area 201 can have more space for disposing other wires. It is to be understood that in other implementations of the present embodiment, gate electrodes 403 of the first thin film transistors 302 in the same group may be connected to the same control signal line.

Figure 2:
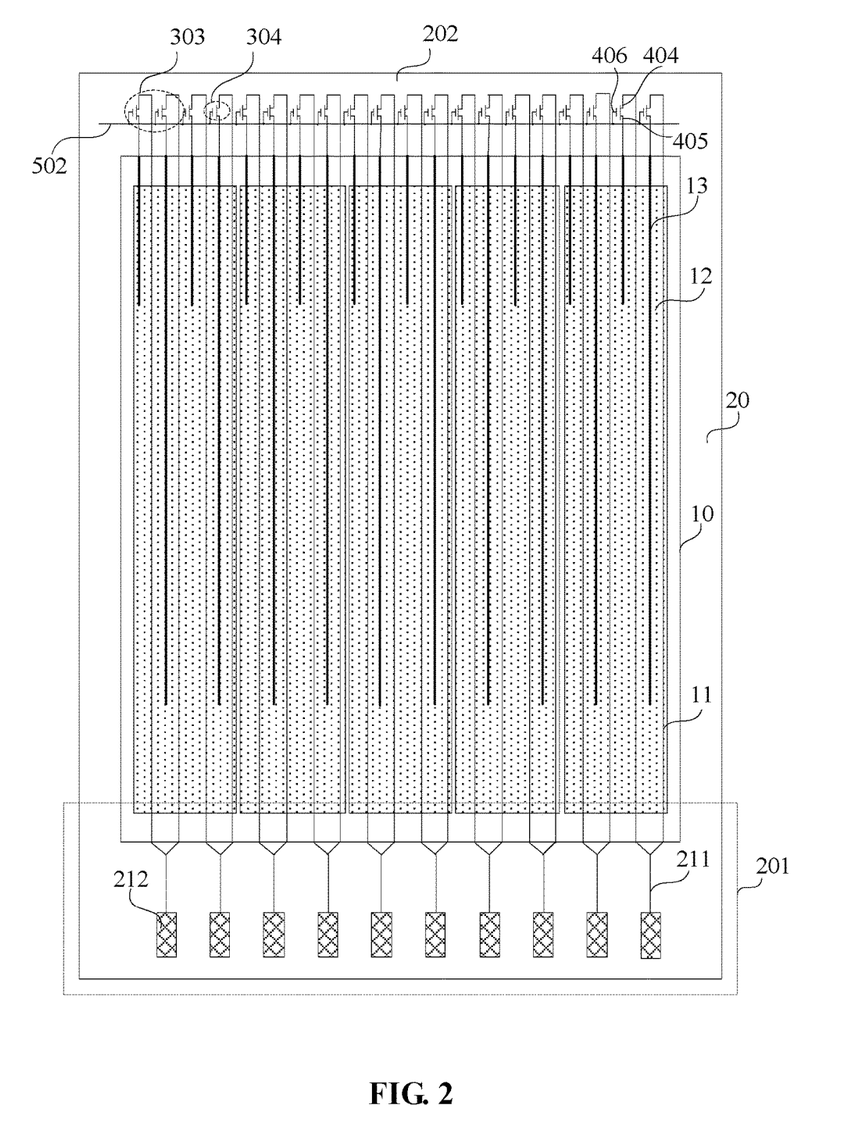
FIG. 2 is a schematic view of a structure of another array substrate according to an embodiment of the present disclosure.

FIG. 2 is a schematic view of a structure of another array substrate according to an embodiment of the present disclosure. As shown in FIG. 2, the array substrate includes a display area 10 and a non-display area 20 surrounding the display area 10. The display area 10 includes a plurality of data lines 11 and a plurality of first touch electrodes 12. A plurality of data signal lines 211 and a plurality of discrete pads 212 are provided in a first non-display area 201 at a side of the display area 10. Each data signal line 211 is connected to at least one data line 11. Each pad 212 is electrically connected to a respective data signal line 211. At least one pad 212 is electrically connected to a respective first touch electrode 12. The pads 212 are configured to supply a data signal to the data lines 11 in a display phase and configured to supply a touch signal to the first touch electrodes 12 in a touch phase. In addition, the array substrate further includes a plurality of second thin film transistor groups 303. The plurality of second thin film transistor groups 303 are disposed in a second non-display area 202 opposite to the first non-display area 201. Each second thin film transistor group 303 includes at least one second thin film transistor 304. A first electrode 404 of each second thin film transistor 304 in each group is connected to a respective data line 11, and a second electrode 405 of each second thin film transistor 304 in each group is electrically connected to the same first touch electrode 12 via a respective touch line 13. Each pad 212 corresponds to at least one data line 11, and the second thin film transistors 304 connected to the at least one data line 11 are in the same group.

It should be noted that, in the display phase, the second thin film transistors 304 are controlled to be turned off, at least one pad 212 supplies a data driving signal to the corresponding data line 11 via the data signal line 211. In the touch phase, the second thin film transistors 304 are controlled to be turned on, at least one pad 212 supplies a touch driving signal to the corresponding first touch electrode 12 sequentially via the data signal line 211, the data line 11, the second thin film transistor 304 and the touch line 13. Such configuration allows the data lines 11 to be reused as wires for transmitting the touch driving signal in the touch phase, and therefore, it is not necessary to additionally dispose the corresponding wires in the non-display area 20, facilitating a narrow lower bezel of the display device.

Optionally, gate electrodes 406 of all the second thin film transistors 304 in FIG. 2 may be connected to a same control signal line 502. Such configuration allows all of the second thin film transistors 304 to be turned on under the control of the same control signal, simplifying the operation, and since only one touch signal line 502 is required, the second non-display area 202 can have more space for disposing other wires. It is to be understood that in other implementations of the present embodiment, gate electrodes 406 of the second thin film transistors 304 in the same group may be connected to the same control signal line.

Exemplarily, as shown in FIG. 2, at least two pads 212 may be electrically connected to the same first touch electrode 12. Such configuration allows one first touch electrode 12 to correspond to multiple touch lines 13, thereby enabling different positions of the same first touch electrode 12 to be electrically connected to different touch lines 13 and avoiding a phenomenon that the touch driving signal becomes weaker due to signal attenuation at a position far away from the connecting point of the touch line 13 and the first touch electrode 12.

Figure 3:
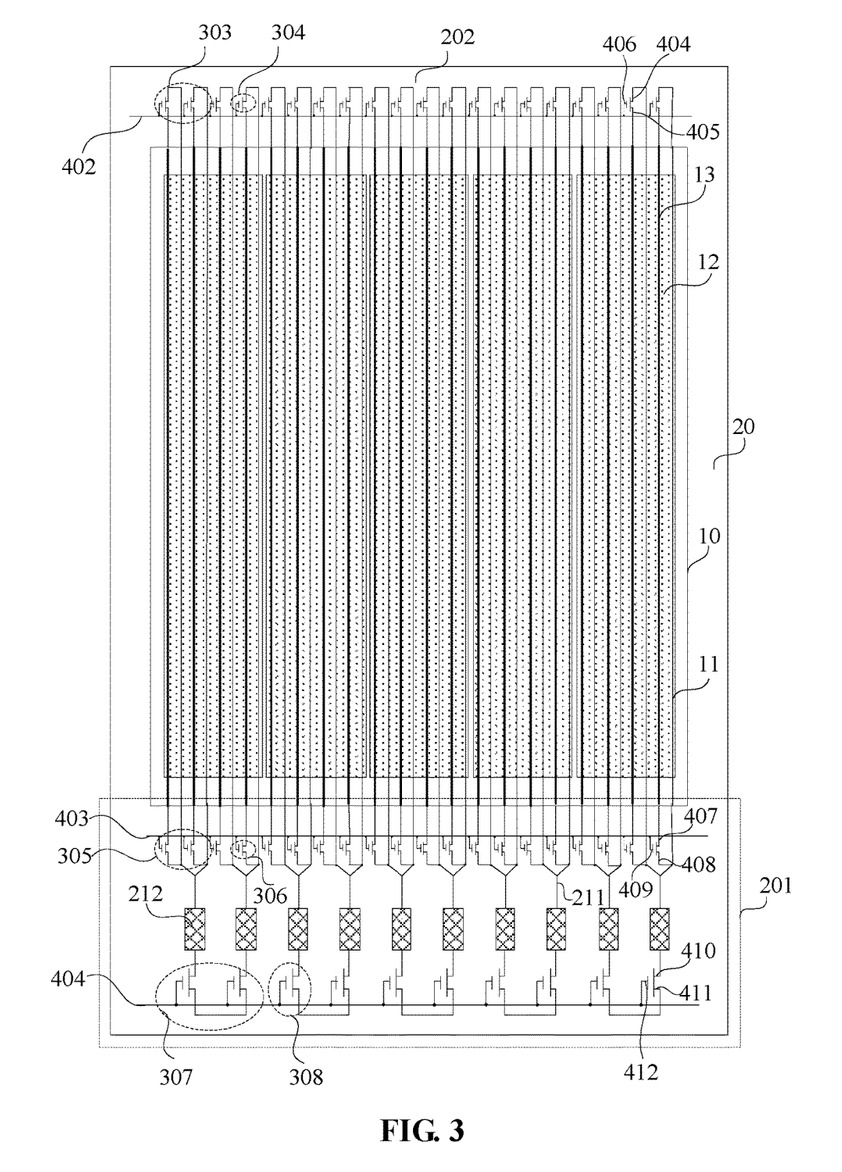
FIG. 3 is a schematic view of a structure of yet another array substrate according to an embodiment of the present disclosure.

FIG. 3 is a schematic view of a structure of yet another array substrate according to an embodiment of the present disclosure. As shown in FIG. 3, the array substrate includes a display area 10 and a non-display area 20 surrounding the display area 10. The display area 10 includes a plurality of data lines 11 and a plurality of first touch electrodes 12. A plurality of data signal lines 211 and a plurality of discrete pads 212 are provided in a first non-display area 201 at a side of the display area 10. Each data signal line 211 is connected to at least one data line 11. Each pad 212 is electrically connected to a respective data signal line 211. At least one pad 212 is electrically connected to a respective first touch electrode 12. The pads 212 are configured to supply a data signal to the data lines 11 in a display phase and configured to supply a touch signal to the first touch electrodes 12 in a touch phase. The array substrate further includes a plurality of second thin film transistor groups 303. The plurality of second thin film transistor groups 303 are disposed in a second non-display area 202 opposite to the first non-display area 201. Each second thin film transistor group 303 includes at least one second thin film transistor 304. A first electrode 404 of each second thin film transistor 304 in each group is connected to a respective data line 11, and a second electrode 405 of each second thin film transistor 304 in each group is electrically connected to the same first touch electrode 12 via a respective touch line 13. Each pad 212 corresponds to at least one data line 11, and the second thin film transistors 304 connected to the at least one data line 11 are in the same group. In addition, the array substrate further includes a plurality of third thin film transistor groups 305. The plurality of third thin film transistor groups 305 is disposed in the first non-display area 201. Each third thin film transistor group 305 includes at least one third thin film transistor 306. The third thin film transistors 306 and the second thin film transistors 304 are in a one-to-one correspondence. A first electrode 407 of each third thin film transistor 306 is electrically connected to the second electrode 405 of the corresponding second thin film transistor 304 via a respective touch line 13. A second electrode 408 of each third thin film transistor 306 is electrically connected to the data line 11 electrically connected to the first electrode 404 of the corresponding second thin film transistor 304.

It should be noted that, in contrast to the array substrate shown in FIG. 2, the third thin film transistor groups 305 are added to the array substrate shown in FIG. 3, so that in the touch phase, the touch driving signal can be outputted from the at least one pad 212 to the corresponding first touch electrode 12 not only via the data signal line 211, the data line 11 and the second thin film transistor 304 but also via the data signal line 211 and the third thin film transistor 306, thereby ensuring that the first touch electrode 12 receives touch driving signals with more similar intensities in an extending direction of the touch lines 13. In addition, both the data line 11 and the touch line 13 overlap the first touch electrode 12 in a stacking direction of films of the array substrate, so such configuration can further achieve a beneficial effect of reducing the impedance of the first touch electrode 12.

Optionally, as shown in FIG. 3, gate electrodes 409 of all the third thin film transistors 306 may be connected to a same control signal line 403. Such configuration allows all of the third thin film transistors 306 to be turned on under the control of the same control signal, simplifying the operation, and since only one touch signal line 403 is required, the first non-display area 201 can have more space for disposing other wires. It is to be understood that in other implementations of the present embodiment, gate electrodes 409 of the third thin film transistors 306 in the same group may be connected to the same control signal line.

Exemplarily, as shown in FIG. 3, a plurality of fourth thin film transistor groups 307 may be disposed in the first non-display area 201. Each fourth thin film transistor group 307 includes at least two fourth thin film transistors 308. A first electrode 410 of each fourth thin film transistor 308 in each group is electrically connected to a respective pad 212, and second electrodes 411 of the fourth thin film transistors 308 in each group are connected to each other.

It should be noted that when each fourth thin film transistor 308 is turned on, the at least one pad 212 connected to the fourth thin film transistors 308 in the same group is electrically connected to each other. Such configuration ensures a better stability in the data driving signal or the touch driving signal outputted from the at least one pad 212.

Optionally, as shown in FIG. 3, gate electrodes 412 of all the fourth thin film transistors 308 may be connected to a same control signal line 404. Such configuration allows all of the fourth thin film transistors 308 to be turned on under the control of the same control signal, simplifying the operation, and since only one touch signal line 404 is required, the first non-display area 201 can have more space for disposing other wires. It is to be understood that in other implementations of the present embodiment, gate electrodes 412 of the fourth thin film transistors 308 in the same group may be connected to the same control signal line.

Continuing to refer to FIG. 3, in the stacking direction of function films of the array substrate, each touch line 13 may overlap the corresponding first touch electrode 12. Capacitance may be formed between each overlapping touch line 13 and the corresponding first touch electrode 12, thereby achieving the beneficial effect of reducing the impedance of the first touch electrode 12.

Optionally, the first touch electrode 12 may be a touch driving electrode or a touch sensing electrode. As shown in FIG. 3, a plurality of touch driving electrodes or a plurality of touch sensing electrodes are arranged in parallel strips and extend in a same direction as the data lines 11.

Figure 4:
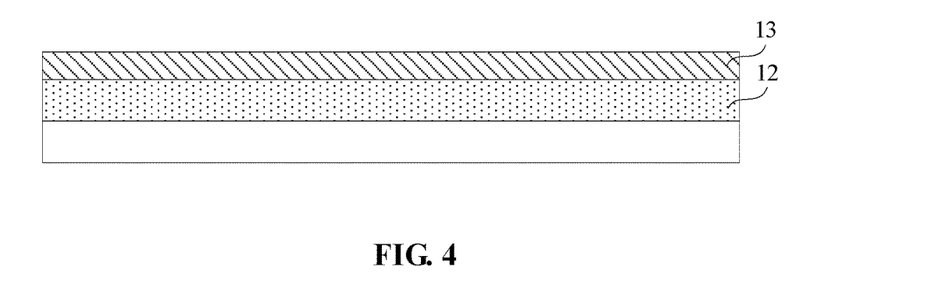
FIG. 4 is a cross sectional view taken along a straight line where any touch line in FIG. 3 is located.

FIG. 4 is a sectional view taken along a straight line where any touch line in FIG. 3 is located. As shown in FIG. 4, each touch line 13 may be in electrical contact with an overlapping part between each touch line 13 and the corresponding first touch electrode 12. In such configuration, it is not necessary to arrange an insulating layer between each touch line 13 and the corresponding first touch electrode 12, so that the number of films of the array substrate is small, favoring the thinning of the display device.

Figure 5:
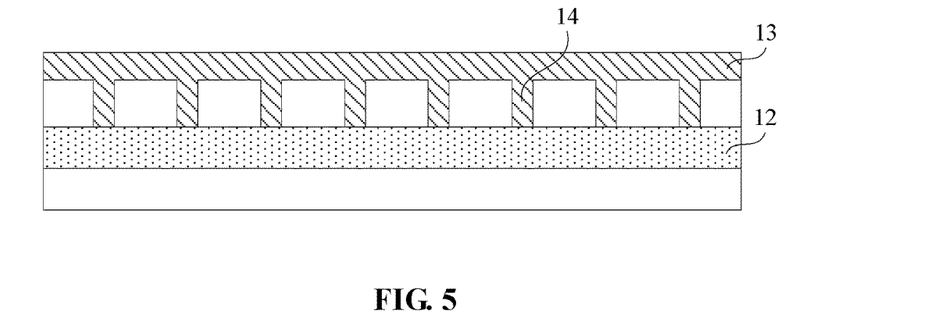
FIG. 5 is another cross sectional view taken along a straight line where any touch line in FIG. 3 is located.

FIG. 5 is another sectional view taken along a straight line where any touch line in FIG. 3 is located. As shown in FIG. 5, each touch line 13 is electrically connected to an overlapping part between each touch line 13 and the corresponding first touch electrode 12 via a plurality of through holes 14 dotted around. Such configuration allows each touch line 13 and the corresponding first touch electrode 12 to form capacitance, thereby reducing the impedance of the first touch electrode 12.

Exemplarily, the array substrate includes a glass substrate. The plurality of discrete pads 212 may be disposed on the glass substrate. Since the glass substrate is a rigid substrate, the positions of the plurality of discrete pads 212 are fixed after being formed, favoring connection to corresponding control chip pins in a subsequent step.

In the present embodiment, the array substrate may further include a common electrode. The common electrode is shared as the first touch electrode 12. Such configuration facilitates simplifying the structure of the array substrate and reducing the number of films of the array substrate, and facilitates the thinning of the display device.

Figure 6:
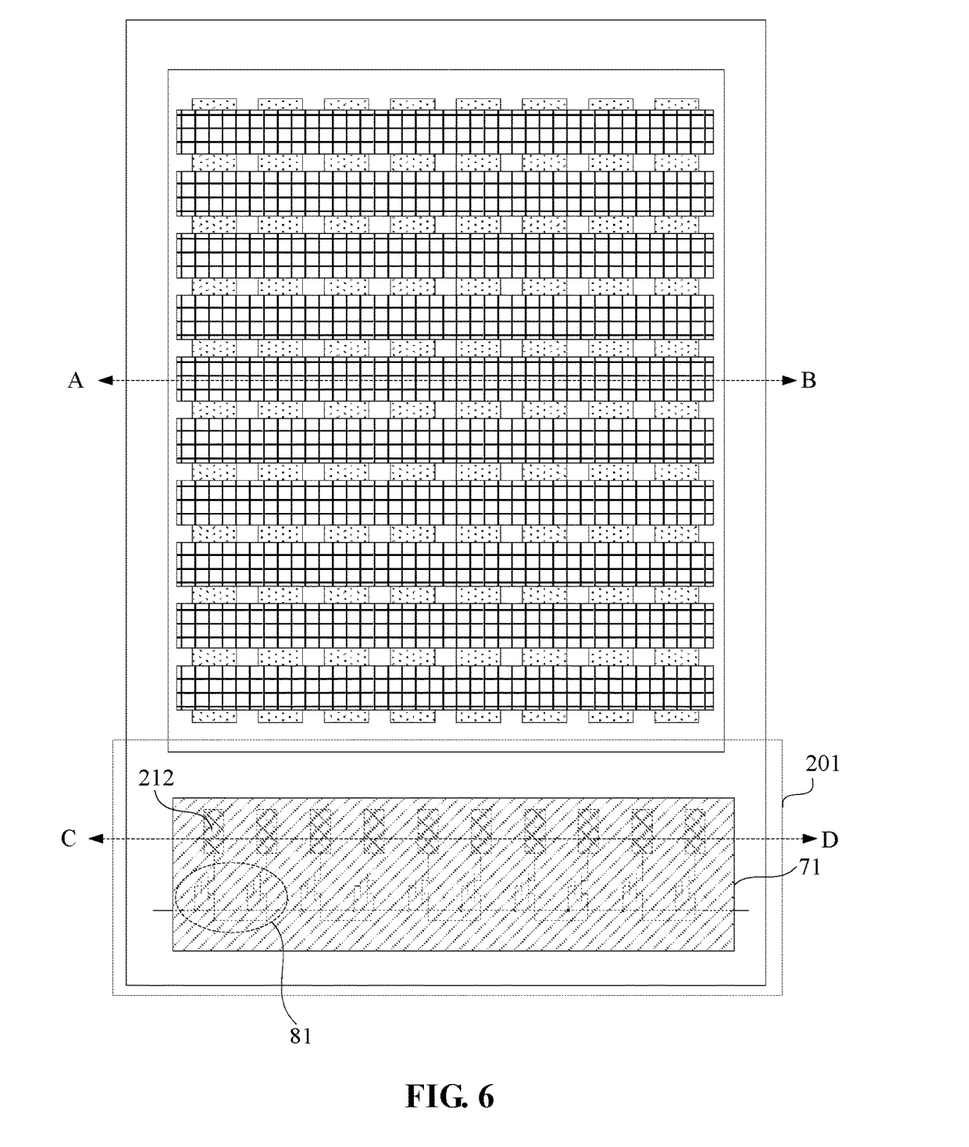
FIG. 6 is a schematic view of a structure of a display panel according to an embodiment of the present disclosure.
Figure 7:
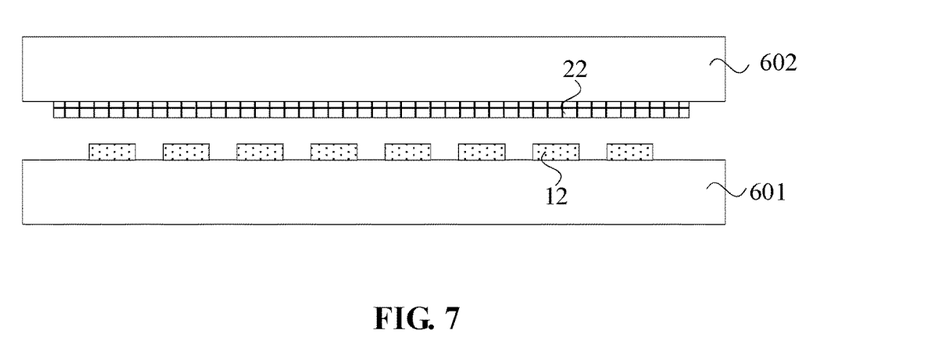
FIG. 7 is a cross sectional view taken along a dotted line AB in FIG. 6.

FIG. 6 is schematic view of a structure of a display panel according to an embodiment of the present disclosure. FIG. 7 is a sectional view taken along a dotted line AB in FIG. 6. As shown in FIG. 7, the display panel includes an array substrate 601 described in any embodiment of the present disclosure and a color filter substrate 602 opposite to the array substrate 601.

Continuing to refer to FIG. 7, the color filter substrate 602 may be provided with second touch electrodes 22 at a side of the color filter substrate 602 towards the array substrate 601, or at a side of the color filter substrate 602 facing away from the array substrate 601. The first touch electrodes 12 coordinates with the second touch electrodes 22 in a touch detection. When the first touch electrodes 12 are the touch driving electrodes, the second touch electrodes 22 are touch sensing electrodes. When the first touch electrodes 12 are the touch sensing electrodes, the second touch electrodes 22 are the touch driving electrodes.

As shown in FIG. 6, the display panel further include a control chip 71 disposed on the array substrate. The control chip is disposed in the first non-display area 201. The control chip 71 covers a plurality of thin film transistor groups 81 in the stacking direction of function films of the array substrate. The plurality of thin film transistor groups 81 may be the first thin film transistor groups 301 shown in FIG. 1 or the fourth thin film transistor groups 307 shown in FIG. 3.

It should be noted that, the control chip 71 is typically provided with only pins electrically connected to the pads 212 and disposed at an edge, and the glass substrate corresponding to a center area is designed without circuit, resulting in a waste of this area. In the present embodiment, the plurality of thin film transistor groups 81 are provided in the area covered by the control chip 71 to effectively utilize the space of the area covered by the control chip 71, thereby reducing the overall area of the first non-display area 201 where the control chip 71 is located, and facilitating the narrow bezel of the display device.

Figure 8:
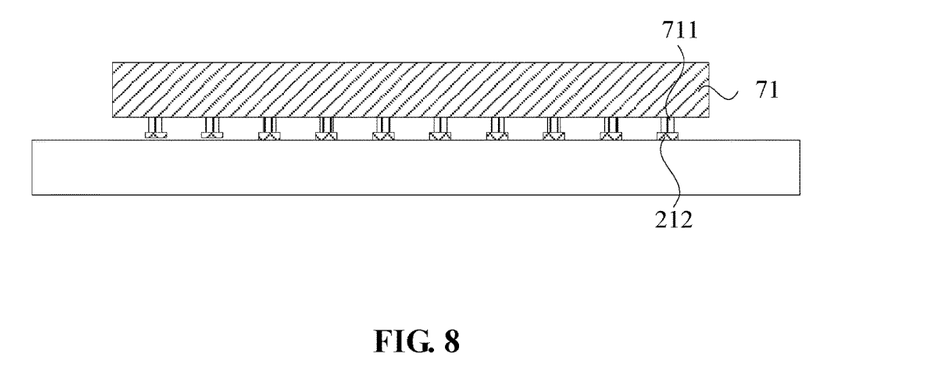
FIG. 8 is a cross sectional view taken along a dotted line CD in FIG. 6.

FIG. 8 is a sectional view taken along a dotted line CD in FIG. 6. As shown in FIG. 8, each of a plurality of data output pins 711 of the control chip 71 may be connected to a respective discrete pad 212, so that the control chip 71 can output corresponding control signals to the corresponding discrete pads 212.

Figure 9:
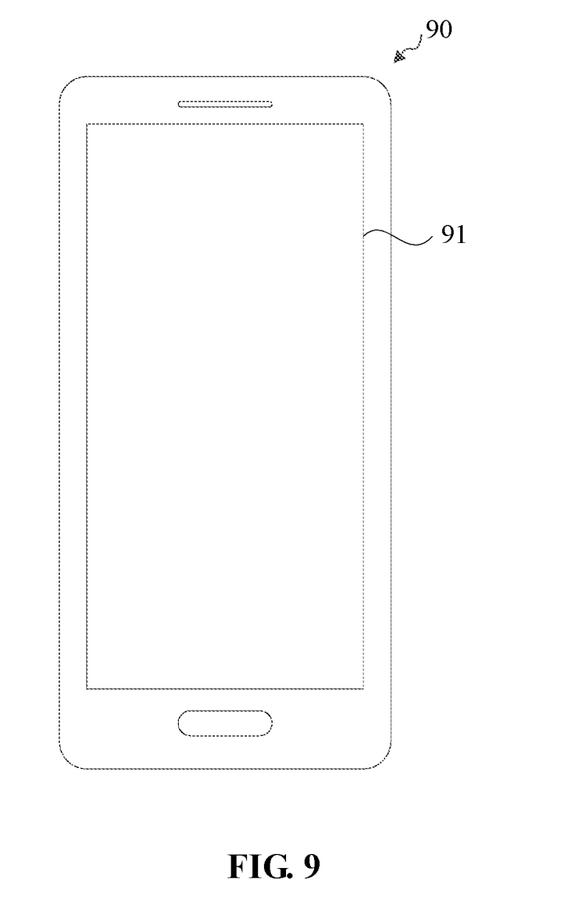
FIG. 9 is a schematic view of a structure of a display device according to an embodiment of the present disclosure.

FIG. 9 is schematic view of a structure of a display device according to an embodiment of the present disclosure. As shown in FIG. 9, a display device 90 includes the display panel 91 described in any embodiment of the present disclosure.

It is to be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising a display area and a non-display area surrounding the display area,
    wherein the non-display area comprises a first non-display area and a second non-display area opposite to the first non-display area;
    wherein the display area comprises a plurality of data lines, a plurality of touch lines, and a plurality of first touch electrodes;
    wherein a plurality of data signal lines and a plurality of discrete pads are provided in the first non-display area;
    wherein each of the plurality of data signal lines is connected to at least one of the plurality of data lines, the plurality of discrete pads each is electrically connected to one of the plurality of data signal lines respectively, and at least one of the plurality of discrete pads is electrically connected to one of the plurality of first touch electrodes; and
    wherein the plurality of discrete pads are configured to supply a data signal to the plurality of data lines in a display phase and to supply a touch signal to the plurality of first touch electrodes in a touch phase;
    wherein the array substrate further comprises:
    a plurality of first thin film transistor groups in the first non-display area and a plurality of second thin film transistor groups disposed in the second non-display area;
    wherein each of the plurality of second thin film transistor groups comprises at least one second thin film transistor, a first electrode of the at least one second thin film transistor is connected to one of the plurality of data lines, and wherein a second electrode of each of the at least one second thin film transistor is connected to a same first touch electrode via one of the plurality of touch lines;
    wherein each of the plurality of discrete pads connects to at least one of the plurality of data lines, wherein the at least one second thin film transistor connected to the at least one data line is in a same second thin film transistor group.

2. The array substrate of claim 1, wherein a plurality of touch signal lines are provided at least in the first non-display area, and wherein the plurality of touch lines connected to a same touch signal line are connected to a same first touch electrode; and
    wherein the plurality of first thin film transistor groups each comprises at least one first thin film transistor, a first electrode of the at least one first thin film transistor is connected to one of the plurality of pads, and a second electrode of the at least one first thin film transistor is connected to a same touch signal line.

3. The array substrate of claim 2, wherein gate electrodes of the at least one first thin film transistor in the plurality of first thin film transistor groups are connected to a same control signal line.

4. The array substrate of claim 1, wherein gate electrodes of the at least one second thin film transistors in the plurality of second thin film transistor groups are connected to a same control signal line.

5. The array substrate of claim 1, wherein at least two of the plurality of pads are electrically connected to a same first touch electrode.

6. The array substrate of claim 1, further comprising a plurality of third thin film transistor groups disposed in the first non-display area, wherein the plurality of third thin film transistor groups each includes at least one third thin film transistor, and wherein the at least one third thin film transistor in the plurality of third thin film transistor groups is associated with one second thin film transistor in the plurality of second thin film transistor groups; and
    wherein a first electrode of the at least one third thin film transistor is electrically connected to the second electrode of an associated second thin film transistor via one of the plurality of touch lines, and a second electrode of the at least one third thin film transistor is electrically connected to one of the plurality of first data lines that is connected to a first electrode of the associated second thin film transistor.

7. The array substrate of claim 6, wherein gate electrodes of all the at least one third thin film transistors in the plurality of third thin film transistor groups are connected to a same control signal line.

8. The array substrate of claim 1 wherein a plurality of fourth thin film transistor groups are provided in the first non-display area, wherein each of the plurality of fourth thin film transistor groups comprises at least two fourth thin film transistors, a first electrode of the at least two fourth thin film transistors each in one of the plurality of fourth thin film transistor groups is connected to one of plurality of pads, and second electrodes of the at least two fourth thin film transistors in each of the plurality of fourth thin film transistor groups are connected to each other.

9. The array substrate of claim 8, wherein gate electrodes of all fourth thin film transistors in the plurality of fourth thin film transistor groups are connected to a same control signal line.

10. The array substrate of claim 1, wherein the plurality of second touch lines each overlays one of the plurality of first touch electrodes in a perpendicular direction of the array substrate.

11. The array substrate of claim 10, wherein each of the plurality of the touch lines is in electrical contact with an overlapping part between each of the plurality of the touch lines and the corresponding first touch electrode.

12. The array substrate of claim 10, wherein each of the plurality of the touch lines is electrically connected to the overlapping part between each of the plurality of the touch lines and the corresponding first touch electrode via a through-hole.

13. The array substrate of claim 1, further comprising a glass substrate, wherein the plurality of discrete pads are disposed on the glass substrate.

14. The array substrate of claim 1, wherein the plurality of first touch electrodes are touch driving electrodes or touch sensing electrodes arranged in parallel strips and extending in a direction same as the plurality of data lines.

15. The array substrate of claim 1, further comprising a common electrode shared as at least one of the plurality of first touch electrodes.

16. A display panel, comprising an array substrate, a color filter substrate opposite to the array substrate, and a control chip,
- wherein the array substrate comprises a display area and a non-display area surrounding the display area;
- wherein the display area comprises a plurality of data lines and a plurality of first touch electrodes;
- wherein a plurality of data signal lines and a plurality of discrete pads are provided in a first non-display area at a side of the display area;
- wherein each of the plurality of data signal lines is connected to at least one of the plurality of data lines, the plurality of discrete pads each is electrically connected to one of the plurality of data signal lines respectively, and at least one of the plurality of discrete pads is electrically connected to one of the plurality of first touch electrodes; and
- wherein the plurality of discrete pads are configured to supply a data signal to the plurality of data lines in a display phase and to supply a touch signal to the plurality of first touch electrodes in a touch phase,
- wherein the control chip is disposed in the first non-display area and covers a plurality of first thin film transistor groups or a plurality of fourth thin film transistor groups perpendicular to the array substrate; and
- wherein each of a plurality of data output pins of the control chip is connected to one of the plurality of discrete pads respectively.

17. The display panel of claim 16, wherein second touch electrodes are provided at a side of the color filter substrate towards the array substrate, or at a side of the color filter substrate facing away from the array substrate; wherein the plurality of first touch electrodes coordinate with the second touch electrodes in a touch detection.

18. A display device, comprising a display panel, wherein the display panel comprises an array substrate and a color filter substrate opposite to the array substrate,
- wherein the array substrate comprises a display area and a non-display area surrounding the display area;
- wherein the non-display area comprises a first non-display area and a second non-display area opposite to the first non-display area;
- wherein the display area comprises a plurality of data lines, a plurality of touch lines, and a plurality of first touch electrodes;
- wherein a plurality of data signal lines and a plurality of discrete pads are provided in the first non-display area;
- wherein each of the plurality of data signal lines is connected to at least one of the plurality of data lines, the plurality of discrete pads each is electrically connected to one of the plurality of data signal lines respectively, and at least one of the plurality of discrete pads is electrically connected to one of the plurality of first touch electrodes; and
- wherein the plurality of discrete pads are configured to supply a data signal to the plurality of data lines in a display phase and to supply a touch signal to the plurality of first touch electrodes in a touch phase;
- wherein the array substrate further comprises: a plurality of first thin film transistor groups in the first non-display area, a plurality of second thin film transistor groups disposed in the second non-display area, and a plurality of touch signal lines at least in the first non-display area;
- wherein the plurality of touch lines connected to a same touch signal line are connected to a same first touch electrode;
- wherein each of the plurality of second thin film transistor groups comprises at least one second thin film transistor, a first electrode of the at least one second thin film transistor is connected to one of the plurality of data lines and a second electrode of each of the at least one second thin film transistor is connected to a same first touch electrode via one of the plurality of touch lines;
- wherein each of the plurality of discrete pads connects to at least one of the plurality of data lines, wherein the at least one second thin film transistor connected to the at least one data line is in a same second thin film transistor group.

* * * * *

UNITED STATES PATENT AND TRADEMARK OFFICE
CERTIFICATE OF CORRECTION

PATENT NO. : 10,365,743 B2
APPLICATION NO. : 15/787970
DATED : July 30, 2019
INVENTOR(S) : Chaohuang Pan et al.

Page 1 of 1

It is certified that error appears in the above-identified patent and that said Letters Patent is hereby corrected as shown below:

On the Title Page

Item (71) City: "Shanghai" should read --Xiamen--.

Signed and Sealed this
Twenty-fourth Day of December, 2019

Andrei Iancu
*Director of the United States Patent and Trademark Office*